United States Patent
Sekiya et al.

(10) Patent No.: US 8,895,326 B2
(45) Date of Patent: Nov. 25, 2014

(54) METHOD OF ATTACHING WAFER TO SHEET

(71) Applicant: Disco Corporation, Tokyo (JP)

(72) Inventors: Kazuma Sekiya, Tokyo (JP); Hiroshi Onodera, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/069,654

(22) Filed: Nov. 1, 2013

(65) Prior Publication Data

US 2014/0134761 A1 May 15, 2014

(30) Foreign Application Priority Data

Nov. 15, 2012 (JP) ................................. 2012-251445

(51) Int. Cl.
*G01R 31/26* (2014.01)
*H01L 21/66* (2006.01)
*H01L 21/762* (2006.01)

(52) U.S. Cl.
CPC .......... *H01L 22/12* (2013.01); *H01L 21/76251* (2013.01)
USPC .... 438/15; 438/14; 257/E21.52; 257/E21.503

(58) Field of Classification Search
None
See application file for complete search history.

(56) References Cited

U.S. PATENT DOCUMENTS

| | | | |
|---|---|---|---|
| 6,579,748 B1 * | 6/2003 | Okuno et al. | 438/124 |
| 2009/0176336 A1 * | 7/2009 | Takahashi et al. | 438/127 |
| 2013/0052756 A1 * | 2/2013 | Okujo et al. | 438/7 |

FOREIGN PATENT DOCUMENTS

JP 2009-148866 7/2009

* cited by examiner

*Primary Examiner* — Charles Garber
*Assistant Examiner* — Abdulfattah Mustapha
(74) *Attorney, Agent, or Firm* — Greer Burns & Crain, Ltd.

(57) ABSTRACT

A wafer attaching method of attaching a wafer having a warp to a sheet includes a wafer warp detecting step of detecting a surface shape of the wafer, a wafer positioning step of applying a photocuring liquid resin to the sheet and positioning the wafer so that a predetermined surface of the wafer corresponding to attaching conditions preset in a resin bonding apparatus is opposed to the sheet and the liquid resin according to the preset attaching conditions and the surface shape detected above, and a wafer attaching step of pressing the wafer against the liquid resin to thereby spread the liquid resin over the entire area where the wafer and the sheet are superimposed, next removing the pressure applied to the wafer, and next applying light to the liquid resin to cure the liquid resin, thereby attaching the predetermined surface of the wafer to the sheet.

2 Claims, 3 Drawing Sheets

METHOD OF ATTACHING WAFER TO SHEET

BACKGROUND OF THE INVENTION

1. Field of the Invention

The present invention relates to a wafer attaching method of attaching a wafer having a warp to a sheet.

2. Description of the Related Art

A wafer to be used in manufacturing semiconductor devices is formed by slicing a solid cylindrical ingot of silicon, for example, by using a wire saw. The wafer thus obtained by slicing (as-sliced wafer) has a warp due to the processing accuracy of the wire saw. It is difficult to accurately form semiconductor devices on such a wafer having a warp, and it is therefore necessary to remove the warp by any method such as grinding, thereby planarizing the wafer. However, when the wafer is held under suction on a chuck table of a grinding apparatus, the wafer is deformed by a suction force to temporarily lose the warp. Accordingly, the warp cannot be properly removed by grinding. To cope with this problem, there has been proposed a method of attaching a wafer having a warp to a film (sheet) in the condition where the warp is maintained (see Japanese Patent Laid-open No. 2009-148866, for example).

In this method, a liquid resin curable by light such as ultraviolet light is applied to the wafer, and the wafer is next pressed against the flat film. Accordingly, the wafer is deformed by the pressure against the film, and the resin is spread over the entire contact area between the wafer and the film. Thereafter, the pressure applied to the wafer is removed to restore the warp of the wafer. Thereafter, light is applied to the resin to cure the resin, so that the wafer is fixed through the cured resin to the film in the condition where the warp is maintained. In this manner, the wafer is attached to the film in the condition where the warp is maintained, thereby allowing proper removal of the warp by any method such as grinding.

SUMMARY OF THE INVENTION

The orientation of the warp of the wafer sliced from the ingot does not necessarily depend on the direction of slicing from the ingot, for example. Accordingly, the orientation of the warp of the wafer to be attached to the film by the above method varies from one wafer to another. In the case that the orientation of the warp varies among wafers as mentioned above, proper attachment of the wafer to the film becomes difficult, causing a possibility that processing defects such as chipping may occur in a subsequent grinding step.

It is therefore an object of the present invention to provide a wafer attaching method which can properly attach a wafer having a warp to a sheet.

In accordance with an aspect of the present invention, there is provided a wafer attaching method of attaching a wafer having a warp to a sheet by using a resin bonding apparatus having preset attaching conditions suitable for either a concave surface or a convex surface of the wafer due to the warp, the wafer attaching method including a wafer warp detecting step of measuring a surface shape of the wafer to detect the concave surface or the convex surface as a predetermined surface; a wafer positioning step of mounting the sheet on a stage of the resin bonding apparatus after performing the wafer warp detecting step, next supplying a liquid resin onto the sheet, and next positioning the wafer above the liquid resin so that the predetermined surface of the wafer detected by the wafer warp detecting step is opposed to the liquid resin according to the attaching conditions; and a wafer attaching step of pressing the wafer against the liquid resin after performing the wafer positioning step to thereby spread the liquid resin over the predetermined surface of the wafer, next removing the pressure applied to the wafer, and next applying light to the liquid resin to cure the liquid resin, thereby attaching the predetermined surface of the wafer through the liquid resin to the sheet.

With this configuration, the wafer is attached to the sheet so that the predetermined surface corresponding to the attaching conditions preset in the resin bonding apparatus is opposed to the liquid resin according to the preset attaching conditions and the surface shape detected. Accordingly, the wafer having a warp can be properly attached to the sheet.

Preferably, the wafer warp detecting step includes the step of detecting the concave surface of the wafer due to the warp; the wafer positioning step includes the step of positioning the wafer above the liquid resin supplied onto the sheet so that the concave surface of the wafer detected by the wafer warp detecting step is opposed to the liquid resin; and the wafer attaching step includes the step of pressing the wafer against the liquid resin to thereby spread the liquid resin over the concave surface of the wafer, next removing the pressure applied to the wafer, and next applying light to the liquid resin to cure the liquid resin, thereby attaching the concave surface of the wafer through the liquid resin to the sheet. With this configuration, the wafer is attached to the sheet so that the concave surface of the wafer is opposed to the liquid resin. Accordingly, even after the pressure applied to the wafer is removed, floating of the peripheral portion of the wafer can be prevented. As a result, even when the wafer has a large warp, the wafer can be properly attached to the sheet.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

The wafer attaching method according to this preferred embodiment includes a wafer warp detecting step, a wafer positioning step, and a wafer attaching step. The wafer warp detecting step is performed by using a shape detecting apparatus 1 to detect the surface shape of a wafer W (see FIG. 1). The wafer positioning step is performed by applying a photocuring resin (liquid resin) R to a sheet S and positioning the wafer W so that a predetermined surface of the wafer W corresponding to the attaching conditions preset in a resin bonding apparatus 2 is opposed to the sheet S and the resin R according to the preset attaching conditions and the surface shape detected above (see FIG. 2). The wafer attaching step is performed by using a press unit 22 included in the resin bonding apparatus 2 to press the wafer W against the resin R and thereby to spread the resin R over the entire area where the wafer W and the sheet S are superimposed (see FIG. 3), next removing the pressure applied to the wafer W (see FIG. 4), and next applying light L from a light source 23 to the resin R to cure the resin R, thereby attaching the predetermined surface of the wafer W to the sheet S (see FIG. 5).

In the wafer attaching method according to this preferred embodiment as mentioned above, the wafer W is positioned so that the predetermined surface corresponding to the attaching conditions is opposed to the sheet S and the resin R according to the attaching conditions preset and the surface shape detected. Accordingly, the wafer W having a warp can be properly attached and fixed to the sheet S. There will now be described the wafer attaching method according to this preferred embodiment in detail with reference to the attached drawings.

Figure 1:
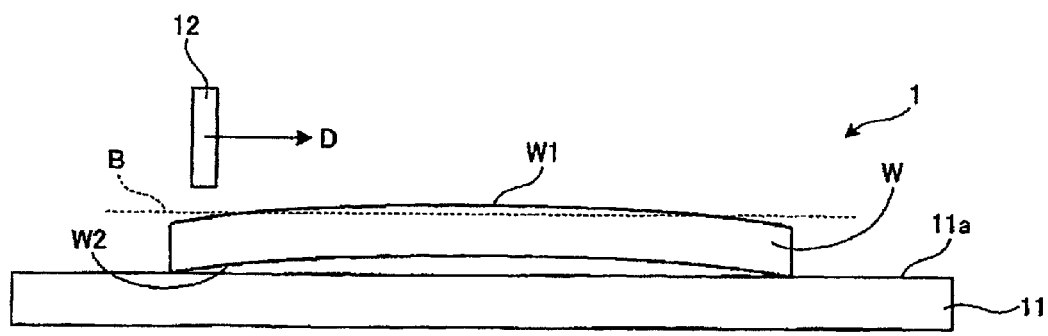
FIG. 1 is a schematic side view showing a manner of detecting the surface shape of a wafer in a wafer warp detecting step.

In the wafer attaching method according to this preferred embodiment, the wafer warp detecting step is first performed to detect the surface shape of the wafer W. FIG. 1 shows a manner of detecting the surface shape of the wafer W in the wafer warp detecting step. The wafer W to be processed by the wafer attaching method is an as-sliced wafer obtained by using a wire saw to slice a solid cylindrical ingot formed of a semiconductor material such as silicon, and this wafer W has a circular outside shape. The wafer W has a warp due to the processing accuracy of the wire saw, for example. In FIG. 1, the wafer W has an upward convex warp.

As shown in FIG. 1, the shape detecting apparatus 1 used in the wafer warp detecting step includes a stage 11 having a mount surface 11a for mounting the wafer W thereon. There is provided above the stage 11 an electrostatic capacity type sensor 12 for detecting an electrostatic capacity between the sensor 12 and the wafer W in a noncontact manner. The sensor 12 is movable parallel to the mount surface 11a of the stage 11. The shape detecting apparatus 1 functions to detect the surface shape of the wafer W according to changes in the electrostatic capacity between the wafer W mounted on the stage 11 and the sensor 12 moved.

When the wafer W is mounted on the stage 11, scanning of the wafer W by the sensor 12 is started. The sensor 12 is moved parallel to the mount surface 11a of the stage 11 and detects the electrostatic capacity every time the sensor 12 travels a predetermined distance. That is, the sensor 12 detects the electrostatic capacity at predetermined intervals in a radial direction D of the wafer W. The electrostatic capacity detected by the sensor 12 at each detecting position in the radial direction D and the coordinates of each detecting position are stored into the shape detecting apparatus 1. Accordingly, distribution data on the electrostatic capacity in the radial direction D is obtained.

The magnitude of the electrostatic capacity detected corresponds to the distance between the upper surface W1 of the wafer W and the sensor 12 located above the upper surface W1. Accordingly, the distance between the sensor 12 and the upper surface W1 can be calculated from the magnitude of the electrostatic capacity detected. The sensor 12 is linearly moved in the radial direction D, so that shape data indicating the outline of the shape of the upper surface W1 can be obtained by converting the electrostatic capacity in the distribution data obtained above into the distance between the sensor 12 and the upper surface W1. This shape data indicates values for the height of the upper surface W1 in the radial direction D.

After the shape data is obtained as mentioned above, the surface shape of the wafer W and the orientation of the warp are determined. For example, this determination is performed by comparing the values for the height of the upper surface W1 indicated by the shape data with a reference line B (see FIG. 1) obtained by averaging the values for the height of the upper surface W1. In the case that the height indicated by the shape data in the central area of the wafer W is greater than the height of the reference line B as shown in FIG. 1, it is determined that the upper surface W1 is a convex surface and the lower surface W2 is a concave surface. Further, it is also determined that the wafer W has an upward convex warp. Conversely, in the case that the height indicated by the shape data in the central area of the wafer W is less than the height of the reference line B, it is determined that the upper surface W1 is a concave surface and the lower surface W2 is a convex surface. Further, it is also determined that the wafer W has a downward convex warp.

Figure 2:
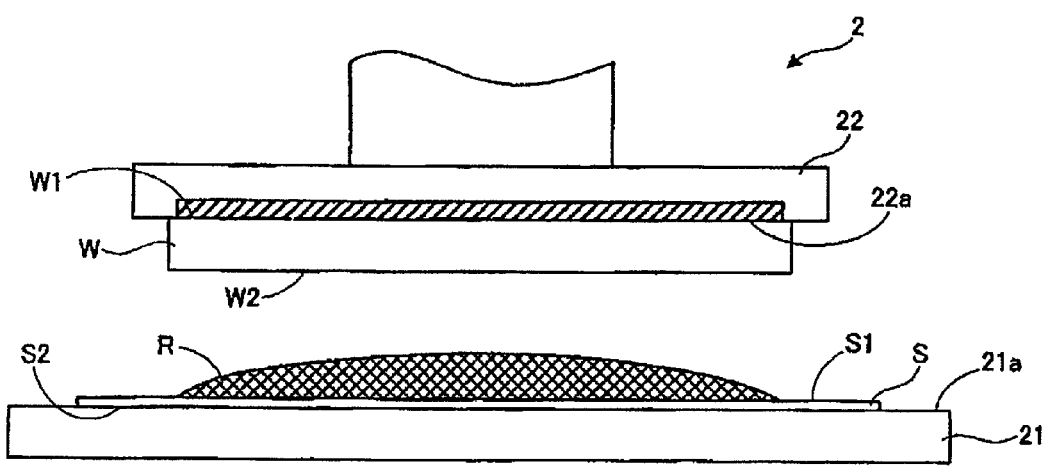
FIG. 2 is a schematic side view showing a manner of positioning the wafer above a sheet and a resin in a wafer positioning step.

After performing the wafer warp detecting step mentioned above, the wafer positioning step is performed. FIG. 2 shows a manner of positioning the wafer W above the sheet S and the resin R in the wafer positioning step. This wafer positioning step is performed by using the resin bonding apparatus 2. As shown in FIG. 2, the resin bonding apparatus 2 includes a stage 21 having a mount surface 21a for mounting the sheet S thereon. The resin bonding apparatus 2 further includes the press unit 22 having a suction holding surface 22a for holding the wafer W under suction. The press unit 22 is provided above the stage 21 so as to be vertically movable. The resin bonding apparatus 2 further includes the light source 23 (see FIG. 5) for radiating light L for curing the resin R. The light source 23 is provided below the stage 21. The stage 21 is capable of transmitting the light L radiated from the light source 23. The resin bonding apparatus 2 further includes a nozzle (not shown) for supplying the resin R in the form of drops onto the sheet S.

First, the sheet S to which the wafer W is to be attached is mounted on the mount surface 21a of the stage 21. The sheet S is a resin film having a flat upper surface S1 and a flat lower surface S2. The sheet S has an area larger than that of the wafer W so that the wafer W can be fully attached to the sheet S. Further, the sheet S is also capable of transmitting the light L radiated from the light source 23 in curing the resin R.

When the sheet S is mounted on the stage 21, the resin R is applied to the upper surface S1 of the sheet S. This resin R is a solventless photocuring resin curable by light such as ultraviolet light. The resin bonding apparatus 2 has preset attaching conditions for specifying the surface shape (warp orientation) of the wafer W, the position of application of the resin R, and the amount of the resin R to be applied so that the wafer W with predetermined orientation can be properly attached to the sheet S.

More specifically, attaching conditions (concave surface attaching conditions) suitable for the case of attaching the concave surface of the wafer W to the sheet S are preset or attaching conditions (convex surface attaching conditions) suitable for the case of attaching the convex surface of the wafer W to the sheet S are preset. The reason why such attaching conditions are preset is that proper attaching conditions are different according to the surface shape of the wafer W facing the sheet S. The resin R is dropped from the nozzle onto the upper surface S1 of the sheet S according to the preset attaching conditions. For example, the concave surface attaching conditions are set so that the amount of the resin R to be supplied to the central area of the sheet S is larger than that to the peripheral area of the sheet S. Conversely, the convex surface attaching conditions are set so that the amount of the resin R to be supplied to the peripheral area of the sheet S is larger than that to the central area of the sheet S. In the case that the convex surface attaching conditions are applied, the stage 21 may be provided by a stage having a concave surface corresponding to the warp of the wafer W. In this case, the amount of the resin R to be supplied is properly set according to the shape of the stage 21. In this preferred embodiment, the concave surface attaching conditions are preset in the resin bonding apparatus 2.

After applying the resin R to the sheet S, the wafer W is held under suction on the suction holding surface 22a provided at the lower end of the press unit 22 and positioned above the sheet S and the resin R. As described above, the predetermined attaching conditions (concave surface attaching conditions or convex surface attaching conditions) are preset in the resin bonding apparatus 2. Accordingly, the predetermined surface of the wafer W satisfying the predetermined attaching conditions is opposed to the sheet S, and the other surface of the wafer W is held under suction on the suction holding surface 22a of the press unit 22.

In this preferred embodiment, the concave surface attaching conditions are preset in the resin bonding apparatus 2 as mentioned above, so that the upper surface W1 as a convex surface is held under suction on the suction holding surface 22a of the press unit 22. In the case that the convex surface attaching conditions are preset in the resin bonding apparatus 2, the lower surface W2 as a concave surface is held under suction on the suction holding surface 22a of the press unit 22. In the case that the surface of the wafer W to be held under suction is not opposed to the suction holding surface 22a, the orientation of the wafer W is changed by an arm (not shown) included in the resin bonding apparatus 2 to thereby oppose the proper surface of the wafer W to the suction holding surface 22a. When the wafer W is held under suction by the press unit 22, the wafer W having a warp is deformed by the suction force to temporarily lose the warp.

After holding the wafer W on the suction holding surface 22a of the press unit 22, the press unit 22 is moved to the position above the sheet S and the resin R, thereby positioning the wafer W above the sheet S and the resin R. In this preferred embodiment, the convex upper surface W1 of the wafer W is held under suction on the suction holding surface 22a of the press unit 22. Accordingly, the concave lower surface W2 of the wafer W is opposed to the sheet S and the resin R. In the case that the concave lower surface W2 of the wafer W is held under suction on the suction holding surface 22a of the press unit 22, the convex upper surface W1 of the wafer W is opposed to the sheet S and the resin R.

Figure 3:
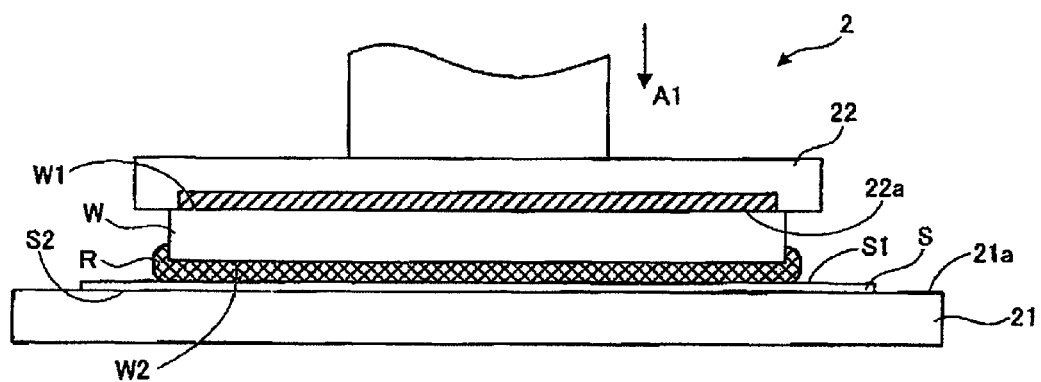
FIG. 3 is a schematic side view showing a manner of pressing the wafer against the resin in a wafer attaching step.

After performing the wafer positioning step mentioned above, the wafer attaching step is performed. FIG. 3 shows a manner of pressing the wafer W in the wafer attaching step, FIG. 4 shows a manner of removing the pressure applied to the wafer W in the wafer attaching step, and FIG. 5 shows a manner of curing the resin R in the wafer attaching step.

As shown in FIG. 3, the press unit 22 of the resin bonding apparatus 2 is lowered to press the wafer W against the resin R. At the time the wafer positioning step is finished, the concave lower surface W2 of the wafer W is opposed to the sheet S. Accordingly, when the press unit 22 is lowered as shown by an arrow A1 in FIG. 3 to press the wafer W against the resin R, the lower surface W2 of the wafer W comes near the upper surface S1 of the sheet S. The resin R is sandwiched between the wafer W and the sheet S and radially spread from the drop position by the pressure of the press unit 22. The pressure of the press unit 22 is adjusted so that the resin R is spread over the entire area where the wafer W and the sheet S are superimposed. Also in the case that the convex upper surface W1 of the wafer W is opposed to the sheet S, the above operation is similarly performed.

Figure 4:
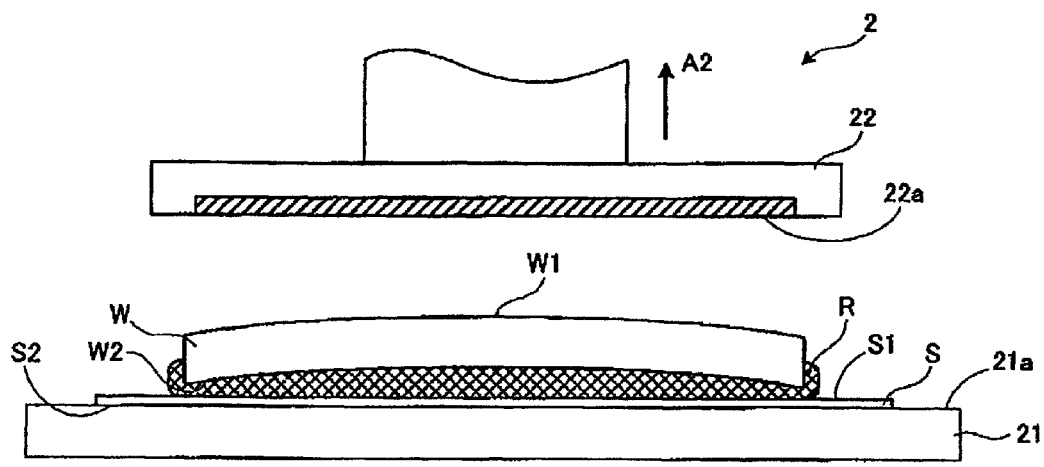
FIG. 4 is a schematic side view showing a manner of removing the pressure applied to the wafer in the wafer attaching step.

After spreading the resin R over the entire area where the wafer W and the sheet S are superimposed, the pressure applied to the wafer W is removed as shown in FIG. 4. More specifically, the suction holding of the wafer W by the suction holding surface 22a of the press unit 22 is canceled and the press unit 22 is next raised as shown by an arrow A2 in FIG. 4. As a result, the suction force and the pressure applied to the wafer W by the press unit 22 are removed and the warp of the wafer W is restored.

Figure 5:
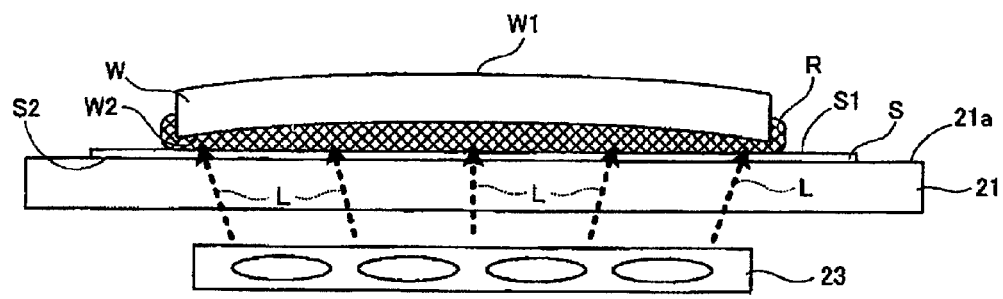
FIG. 5 is a schematic side view showing a manner of curing the resin in the wafer attaching step.

After the wafer W is released from the pressure applied by the press unit 22 to restore the warp as mentioned above, the light L such as ultraviolet light is applied from the light source 23 to the resin R to thereby cure the resin R as shown in FIG. 5. The stage 21 and the sheet S are capable of transmitting the light L radiated from the light source 23. Accordingly, the light L radiated from the light source 23 is applied through the stage 21 and the sheet S to the resin R. The resin R irradiated with the light L is cured by chemical reaction and thereby fixed to the sheet S in the condition where the warp of the wafer W is maintained.

In the wafer attaching method according to this preferred embodiment mentioned above, the wafer W is attached to the sheet S so that the predetermined surface of the wafer W corresponding to the attaching conditions preset in the resin bonding apparatus 2 is opposed to the resin R according to the preset attaching conditions and the surface shape detected. Accordingly, the wafer W having a warp can be properly attached through the resin R to the sheet S. As a result, it is possible to suppress processing defects such as chipping in a subsequent grinding step for the wafer W.

Further, in this preferred embodiment, the concave surface attaching conditions are preset in the resin bonding apparatus 2 and the wafer W is attached to the sheet S in the condition where the concave surface of the wafer W is opposed to the resin R. Accordingly, even after the pressure of the press unit 22 to the wafer W is removed, floating of the peripheral portion of the wafer W can be prevented. As a result, even when the wafer W has a large warp, the wafer W can be properly attached to the sheet S. In the case that the convex surface attaching conditions are preset in the resin bonding apparatus 2 and the wafer W is attached to the sheet S in the condition where the convex surface of the wafer W is opposed to the resin R, floating of the peripheral portion of the wafer W can be prevented by increasing the amount of the resin R to be applied to the peripheral portion of the wafer W. As a modification, floating of the peripheral portion of the wafer W can be prevented by using a stage having a concave upper surface corresponding to the warp of the wafer W as the stage 21.

Figure 6:
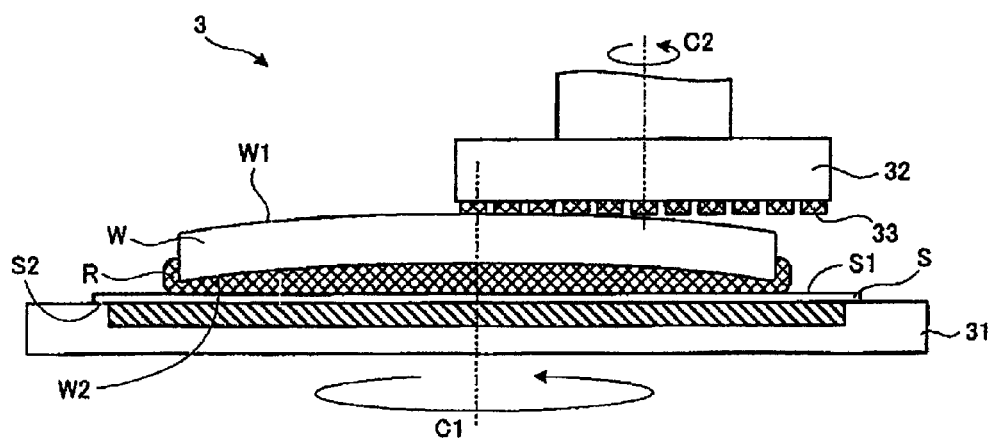
FIG. 6 is a schematic side view showing a manner of grinding the wafer in a grinding step.

After performing the wafer attaching step mentioned above, a grinding step is performed to planarize the wafer W. FIG. 6 shows a manner of grinding the wafer W in the grinding step. As shown in FIG. 6, this grinding step is performed by using a grinding apparatus 3 to grind the surface (the upper surface W1 in this preferred embodiment) of the wafer W opposite to the surface attached to the sheet S. The grinding apparatus 3 includes a holding table 31 having a suction holding surface formed of a porous ceramic material. A rotating mechanism (not shown) is provided below the holding table 31 to rotate the holding table 31 about an axis C1. The wafer W is held through the cured resin R and the sheet S on the holding table 31.

A grinding wheel 32 is provided above the holding table 31 so as to be vertically movable. The grinding wheel 32 is connected to a rotating mechanism (not shown) and rotated about an axis C2 by this rotating mechanism. A plurality of abrasive members 33 are fixed to the lower surface of the grinding wheel 32. The abrasive members 33 are brought into contact with the upper surface W1 of the wafer W, and both the holding table 31 and the grinding wheel 32 are rotated to thereby grind the upper surface W1 of the wafer W. At this time, the grinding wheel 32 is rotated at a speed higher than that of the holding table 31.

A sensor (not shown) is provided in the vicinity of the holding table 31 to measure the thickness and warp of the wafer W. That is, by measuring the thickness and warp of the wafer W in grinding the wafer W, the wafer W can be planarized accurately. As described above, the wafer W is properly attached to the sheet S in the condition where the warp of the wafer W is maintained, so that processing defects such as chipping of the wafer W in the grinding step can be suppressed.

The present invention is not limited to the above preferred embodiment, but various modifications may be made. For example, while a silicon wafer is used as the wafer to be processed by the wafer attaching method in the above preferred embodiment, the wafer usable in the present invention is not limited to a silicon wafer, but may include any semiconductor substrate such as a gallium arsenide (GaAs) substrate, silicon carbide (SiC) substrate, and gallium nitride (GaN) substrate.

Further, while the shape detecting apparatus 1 and the resin bonding apparatus 2 are separated from each other in the above preferred embodiment, these apparatuses 1 and 2 may be integrated. For example, the sensor 12 as shape detecting means may be provided in the resin bonding apparatus 2, and all the steps (wafer warp detecting step, wafer positioning step, and wafer attaching step) may be performed by the resin bonding apparatus 2. Further, the resin bonding apparatus 2 may be configured so that arbitrary attaching conditions can be set by the user.

While the sensor 12 as shape detecting means used in the above preferred embodiment is an electrostatic capacity type sensor, any other types of sensors including a laser sensor (laser displacement gauge) and a contact type sensor may be used. In the case of using a noncontact type sensor such as an electrostatic capacity type sensor and a laser sensor, the occurrence of contamination or flaws on the wafer in the wafer warp detecting step can be suppressed.

Further, while the reference line B obtained by averaging the values for the height indicated by the shape data is used to determine the surface shape of the wafer in the above preferred embodiment, the reference line B may be obtained by any other methods including a least squares method and a moving average method. Further, while the surface shape of the wafer is determined by comparing the height of the central area of the wafer with the height of the reference line B in the above preferred embodiment, the height of the peripheral area of the wafer may be compared with the height of the reference line B.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer attaching method of attaching a wafer having a warp to a sheet by using a resin bonding apparatus having preset attaching conditions suitable for either a concave surface or a convex surface of said wafer due to said warp, said wafer attaching method comprising:
a wafer warp detecting step of measuring a surface shape of said wafer to detect said concave surface or said convex surface as a predetermined surface;
a wafer positioning step of mounting said sheet on a stage of said resin bonding apparatus after performing said wafer warp detecting step, next supplying a liquid resin onto said sheet, and next positioning said wafer above said liquid resin so that said predetermined surface of said wafer detected by said wafer warp detecting step is opposed to said liquid resin according to said attaching conditions; and
a wafer attaching step of pressing said wafer against said liquid resin after performing said wafer positioning step to thereby spread said liquid resin over said predetermined surface of said wafer, next removing the pressure applied to said wafer, and next applying light to said liquid resin to cure said liquid resin, thereby attaching said predetermined surface of said wafer through said liquid resin to said sheet.

2. The wafer attaching method according to claim 1,
wherein said wafer warp detecting step includes the step of detecting said concave surface of said wafer due to said warp;
said wafer positioning step includes the step of positioning said wafer above said liquid resin supplied onto said sheet so that said concave surface of said wafer detected by said wafer warp detecting step is opposed to said liquid resin; and
said wafer attaching step includes the step of pressing said wafer against said liquid resin to thereby spread said liquid resin over said concave surface of said wafer, next removing the pressure applied to said wafer, and next applying light to said liquid resin to cure said liquid resin, thereby attaching said concave surface of said wafer through said liquid resin to said sheet.

* * * * *